US005544110A

United States Patent [19]
Yuh

[11] Patent Number: 5,544,110
[45] Date of Patent: Aug. 6, 1996

[54] SENSE AMPLIFIER FOR SEMICONDUCTOR MEMORY DEVICE HAVING PULL-UP AND PULL-DOWN DRIVING CIRCUITS CONTROLLED BY A POWER SUPPLY VOLTAGE DETECTION CIRCUITRY

[75] Inventor: Jong B. Yuh, Kyoungki-do, Rep. of Korea

[73] Assignee: Hyundai Electronics Industries Co. Ltd., Kyoungki-do, Rep. of Korea

[21] Appl. No.: 389,199

[22] Filed: Feb. 15, 1995

[30] Foreign Application Priority Data

Feb. 16, 1994 [KR] Rep. of Korea ............... 94-2690

[51] Int. Cl.$^6$ ........................................... G11C 7/00
[52] U.S. Cl. ............ 365/205; 365/189.09; 365/190; 365/208; 365/227; 365/228; 327/55; 327/57
[58] Field of Search .............. 365/189.09, 189.11, 365/190, 205, 207, 208, 227, 228; 327/55, 57

[56] References Cited

U.S. PATENT DOCUMENTS 4,694,205  9/1987  Shu et al. ................ 327/53

Primary Examiner—David C. Nelms
Assistant Examiner—Andrew Q. Tran
Attorney, Agent, or Firm—Gary M. Nath; Nath & Associates

[57] ABSTRACT

There is disclosed a sense amplifier for a semiconductor memory device comprising a cross coupled latch for sense-amplifying data signals on bit lines, a pull-up driver connected between the cross coupled latch and a supply voltage source for controlling an amount of current of a supply voltage being supplied to the cross coupled latch, a pull-down driver connected between the cross coupled latch and a ground voltage source for controlling an amount of current of a ground voltage being supplied no the cross coupled latch, and a voltage detector for detecting a difference between the supply voltage and the ground voltage and controlling the pull-up driver and the pull-down driver in accordance with the detected result. According to the present invention, when the voltage difference is high in level, the sense amplifier minimizes a noise component being generated. In the case where the voltage difference is low in level, the sense amplifier amplifies the data signals on the bit lines at a high speed.

2 Claims, 2 Drawing Sheets

5,544,110

SENSE AMPLIFIER FOR SEMICONDUCTOR MEMORY DEVICE HAVING PULL-UP AND PULL-DOWN DRIVING CIRCUITS CONTROLLED BY A POWER SUPPLY VOLTAGE DETECTION CIRCUITRY

BACKGROUND OF THE INVENTION

1. Field of the Invention

The present invention relates in general to a sense amplifier for a semiconductor memory device for sense-amplifying data signals, transferred from memory cells to bit lines, and more particularly, to a sense amplifier for a semiconductor memory device which is capable of minimizing a noise component being generated and enhancing the operating speed of the semiconductor memory device.

2. Description of the Prior Art

In a semiconductor memory device, generally, a sense amplifier is adapted to sense-amplify data signals with a swing width of several tens mV, transferred from memory cells to bit lines, in such a manner that the data signals can have a swing width from a ground voltage to a supply voltage. The bit lines have an extended length because a plurality of memory cells are connected thereto such an extended length allows the bit lines to have a desired impedance. The sense amplifier is degraded in operating speed when the supply voltage is reduced in level, since it consumes at least 30% of an operating current and drives the bit lines. On the other hand, when the supply voltage is increased in level, the sense amplifier is normal in operating speed, but it generates a high noise signal on the data signals, the ground voltage and the supply voltage. Such problems appear more significantly in a refresh mode in which the plurality of memory cells are simultaneously driven. The above problems with the sense amplifier for the semiconductor memory device will hereinafter be described in detail with reference to FIG. 1.

Referring to FIG. 1, there is shown a circuit diagram of a conventional sense amplifier for a semiconductor memory device. As shown in this drawing, the conventional sense amplifier comprises two PMOS transistors MP2 and MP3 and two NMOS transistors MN2 and MP3 connected between true and complementary bit lines BL and/BL to form a cross coupled latch. The sense amplifier further comprises a PMOS transistor MP1 for transferring a supply voltage from a supply voltage source Vcc to the cross coupled latch in response to a first sense amplifier control signal φSEP supplied thereto through an inverter G1, and an NMOS transistor MN1 for transferring a ground voltage from a ground voltage source vss to the cross coupled latch in response to a second sense amplifier control signal φSEN supplied thereto through an inverter G2. Each of capacitors $C_{BL}$ and $C_{/BL}$ is connected to a corresponding one of the true and complementary bit lines BL and/SL by a dotted line to model a parasitic capacitance of the corresponding bit line.

The true and complementary bit lines BL and/BL are supplied with true and complementary data signals from memory cells, the data signals having a potential difference of several tens mV. When the first sense amplifier control signal φSEP inverted by the inverter G1 goes low in logic, the PMOS transistor MP1 is turned on to transfer the supply voltage from the supply voltage source Vcc to the cross coupled latch. When the second sense amplifier control signal φSEN inverted by the inverter G2 goes high in logic, the NMOS transistor MN1 is turned on to transfer the ground voltage from the ground voltage source Vss to the cross coupled latch. The cross coupled latch sense-amplifies the true and complementary data signals on the true and complementary bit lines BL and/BL according to a difference Vcc–Vss between the supply voltage Vcc and the ground voltage vss by the PMOS transistor MP1 and the NMOS transistor MN1. Noticeably, the PMOS transistor MP1 and the NMOS transistor MN1 transfer the voltage difference Vcc–Vss directly to the cross coupled latch in response to the first and second sense amplifier control signals φSEP and φSEN regardless of the level of the voltage difference Vcc–Vss. For this reason, in the case where the voltage difference Vcc–Vss is high in level, the cross coupled latch generates a relatively high noise component on the true and complementary data signals, the ground voltage Vss and the supply voltage Vcc. In the case where the voltage difference Vcc–Vss is low in level, The cross coupled latch sense-amplifies the True and complementary data signals at a relatively low speed. The generation of the noise component and the degradation in the operating speed appear more significantly in a refresh mode in which 1K to 4K memory cells are simultaneously driven.

SUMMARY OF THE INVENTION

Therefore, the present invention has been made in view of the above problems, and it is an object of the present invention to provide a sense amplifier for a semiconductor memory device which is capable of minimizing a noise component being generated when a difference between a supply voltage and a ground voltage is high in level and sense-amplifying data signals on bit lines at a high speed when the difference between the supply voltage and the ground voltage is low in level.

In accordance with the present invention, the above and other objects can be accomplished by providing a sense amplifier for a semiconductor memory device comprising latch means for sense-amplifying data signals on bit lines: pull-up driving means connected between the latch means and a supply voltage source for controlling an amount of current of a supply voltage being supplied to the latch means; pull-down driving means connected between latch means and a ground voltage source for controlling an amount of current of a ground voltage being supplied to the latch means; and voltage detection means for detecting a difference between the supply voltage and the ground voltage and controlling the pull-up driving means and the pull-down driving means in accordance with the detected result.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
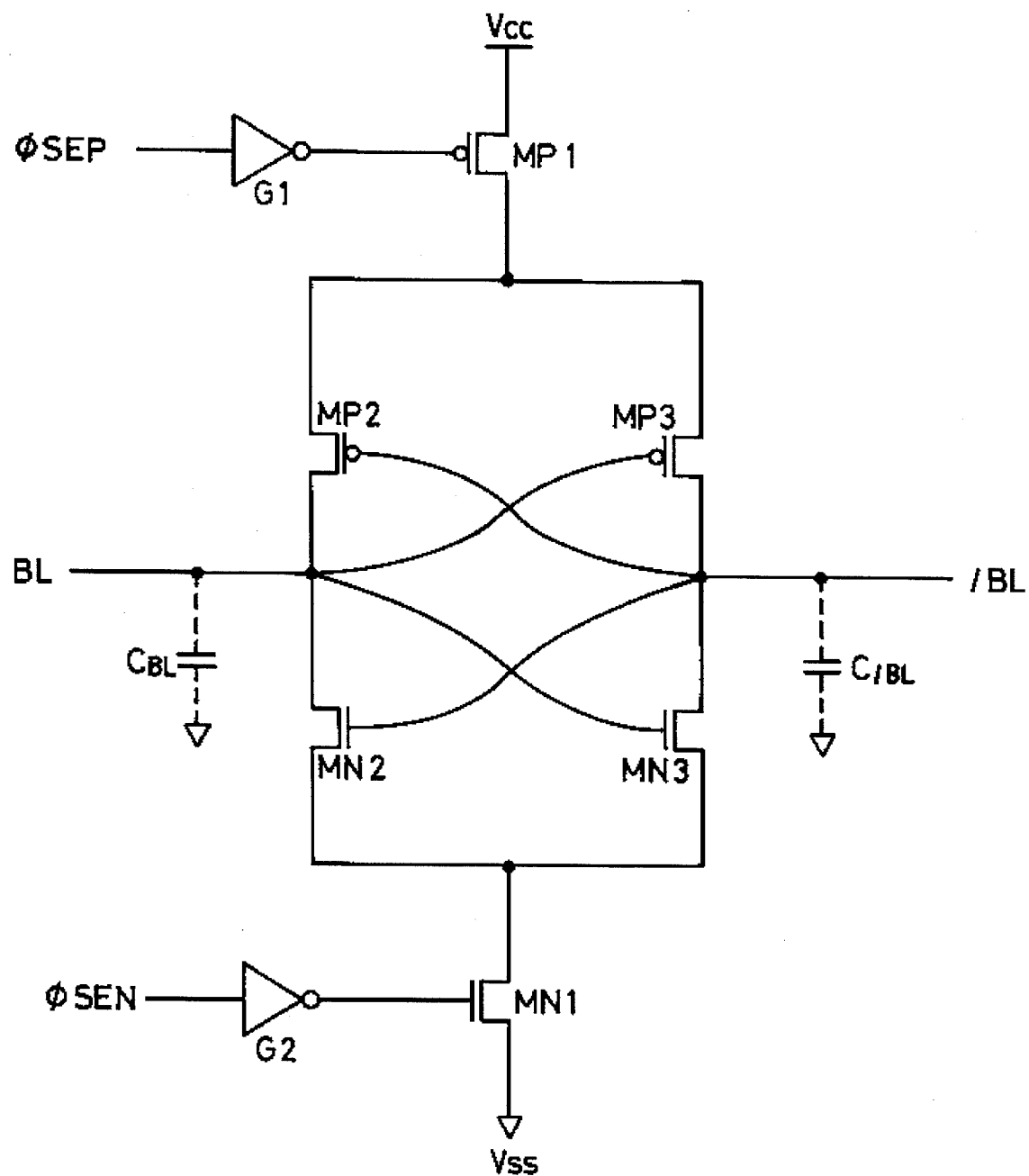
FIG. 1 is a circuit diagram of a conventional sense amplifier for a semiconductor memory device.
Figure 2:
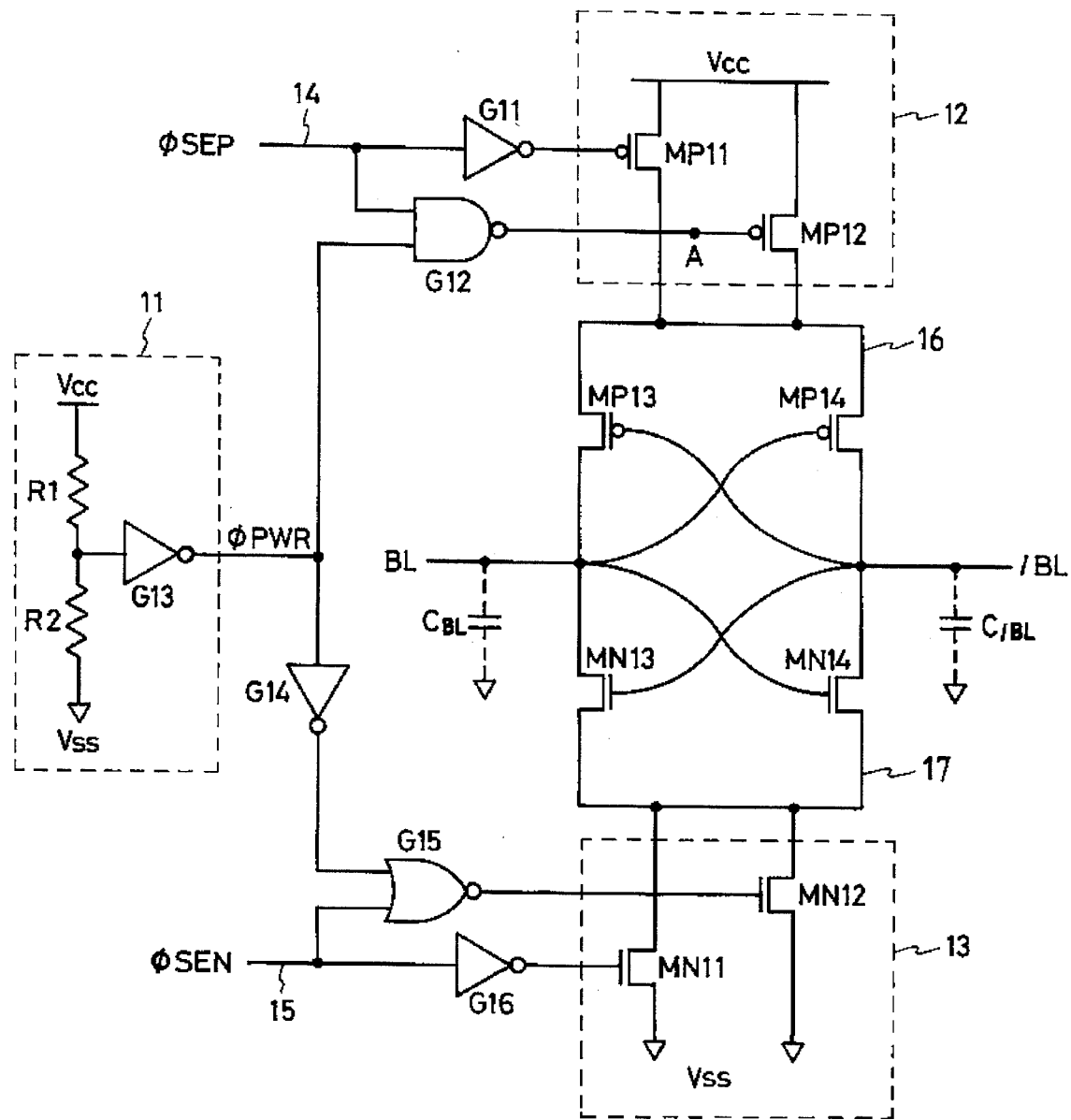
FIG. 2 is a circuit diagram of a sense amplifier for a semiconductor memory device in accordance with an embodiment of the present invention.

Referring to FIG. 2, there is shown a circuit diagram of a sense amplifier for a semiconductor memory device in accordance with an embodiment of the present invention. As shown in this drawing, the sense amplifier comprises two PMOS transistors MP13 and MP14 and two NMOS transistors MN13 and ME14 connected between true and complementary bit lines BL and/BL to form a cross coupled latch. The two PMOS transistors MP13 and MP14 have sources connected in common to a first node 16 and the two NMOS transistors MN13 and MN14 have sources connected in common to a second node 17. Also, the PMOS and NMOS transistors MP13 and MN13 have gates connected in common to the complementary bit line/BL and the PMOS and NMOS transistors MP14 and MN14 have gates connected in common to the true bit line BL. Furthermore, the MOS and NMOS transistors MP13 and MN13 have drains connected in common to the true bit line BL and the PMOS and NMOS transistors MP14 and MN14 have drains connected in common to the complementary bit line/BL. The cross coupled latch with the above-mentioned construction is a well-known circuit and details thereof will thus be omitted. Both capacitors $C_{BL}$ and $C_{BL}$ are connected to a corresponding one of the true and complementary bin lines BL and/BL by a dotted line to model a parasitic capacitance of the corresponding bit line, in a similar manner to that in FIG. 1.

The sense amplifier further comprises a voltage detector 11 for detecting a difference between a supply voltage from a supply voltage source Vcc and a ground voltage from a ground voltage source Vss. The voltage detector 11 includes two resistors R1 and R2 connected in series between the supply voltage source Vcc and the ground voltage source Vss, and an inverter G13 for generating a voltage detection signal φPWR with different logic values according to a level of a voltage divided by the two resistors R1 and R2. The voltage detection signal φPWR from the inverter G13 is high in logic when the divided voltage is lower than a threshold voltage (for example, 0.3 V) of the inverter G13. On the contrary, the voltage detection signal φPWR from the inverter G13 is low in logic when the divided voltage is higher than the threshold voltage of The inverter G13. In result, the inverter G13 functions as a comparator for comparing the voltage divided by the two resistors R1 and R2 with the threshold voltage thereof. The two resistors R1 and R2 have resistances which are properly set in such a manner that the divided voltage can become lower than 0.3 V when the voltage difference Vcc–Vss is lower than a predetermined reference voltage, whereas higher than 0.3 V when the voltage difference Vcc–Vss is higher than the predetermined reference voltage.

The sense amplifier further comprises a pull-up driver 12 for transferring the supply voltage from the supply voltage source Vcc to the cross coupled latch. The pull-up driver 12 includes a PMOS transistor MP11 having a gate for inputting a first sense amplifier control signal φSEP from a first input line 14 through an inverter G11. The PMOS transistor MP11 is driven according to a logic value of the first sense amplifier control signal φSEP inverted by the inverter G11. The pull-up driver 12 further comprises a PMOS transistor MP12 having a gate for inputting an output signal from a NAND gate G12. The PMOS transistor MP12 is selectively driven according to a logic value of the output signal from the NAND gate G12. The inverter G11 acts to invert the first sense amplifier control signal φSEP from the first input line 14. The NAND gate G12 acts to NAND the first sense amplifier control signal φSEP from the first input line 14 and the voltage detection signal φPWR from the inverter G13 in the voltage detector 11. The output signal from the NAND gate G12 is low in logic when the first sense amplifier control signal φSEP from the first input line 14 is high in logic and the voltage difference Vcc–Vss is higher than the predetermined reference voltage. The PMOS transistor MP11 transfers the supply voltage from the supply voltage source vcc to the first node 16 when the inverted first sense amplifier control signal φSEP from the inverter G11 is low in logic. The PMOS transistor MP12 transfers the supply voltage from the supply voltage source vcc to the first node 16 when the output signal from the NAND gate G12 is low in logic. Namely, the PMOS transistors MP11 and MP12 form current paths to the first node 16. In result, when the voltage difference Vcc–Vss is lower than the predetermined reference voltage, the PMOS transistor MP12 is driven together with the PMOS transistor MP11 to increase an amount of current being supplied to the first node 16. On the contrary, when the voltage difference Vcc–Vss is higher than the predetermined reference voltage, only the φPMOS transistor MP11 is driven to reduce the amount of current being supplied to the first node 16.

The sense amplifier further comprises a pull-down driver 13 for transferring the ground voltage from the ground voltage source Vss to the cross coupled latch. The pull-down driver 13 includes an NMOS transistor MN11 having a gate for inputting a second sense amplifier control signal φSEN from a second input line 15 through an inverter G16. The NMOS transistor MN11 is driven according to a logic value of the second sense amplifier control signal φSEN inverted by the inverter G16. The pull-down driver 13 further comprises an NMOS transistor MN2 having a gate for inputting an output signal from a NOR gate G15. The NMOS transistor MN12 is selectively driven according to a logic value of the output signal from the NOR gate G15. The inverter G16 acts to invert the second sense amplifier control signal φSEN from the second input line 15. The NOR gate G15 acts to NOR the second sense amplifier control signal φSEN from the second input line 15 and the voltage detection signal φPWR inverted by an inverter G14. The inverter G14 is adapted to invert the voltage detection signal φPWR from the inverter G13 in the voltage detector 11 and apply the inverted voltage detection signal φPWR to the NOR gate G15. The output signal from the NOR gate G15 is high in logic when the second sense amplifier control signal φSEN from the second input line 15 is low in logic and the voltage difference Vcc–Vss is lower than the predetermined reference voltage. The NMOS transistor MN11 transfers the ground voltage from the ground voltage source Vss to the second node 17 when the inverted second sense amplifier control signal φSEN from the inverter G16 is high in logic. The NMOS transistor MN12 transfers the ground voltage from the ground voltage source Vss to the second node 17 when the output signal from the NOR gate G15 is high in logic. Namely, the NMOS transistors MN11 and MN12 form current paths to the second node 17. In result, when the voltage difference Vcc–Vss is lower than the predetermined reference voltage, the NMOS transistor MN12 is driven together with the NMOS transistor MN11 to increase an amount of current being supplied to the second node 17. On the contrary, when the voltage difference Vcc–Vss is higher than the predetermined reference voltage, only the NMOS transistor MN11 is driven to reduce the amount of current being supplied to the second node 17.

In the case where the voltage difference Vcc–Vss is lower than the predetermined reference voltage, the cross coupled latch sense-amplifies true and complementary data signals on the true and complementary bit lines BL and/BL at a high speed in response to the increased current signals supplied to the first and second nodes 16 and 17. On the contrary, in the case where the voltage difference Vcc–Vss is higher than the predetermined reference voltage the cross coupled latch generates no noise component on the true and complementary data signals on the true and complementary bit lines BL and/BL, the supply voltage and the ground voltage in response to the reduced current signals supplied to the first and second nodes 16 and 17. In result, the cross coupled latch is driven by the current signals being constant in level regardless of a variation in the voltage difference Vcc–Vss. Therefore, the cross coupled latch can sense-amplify the true and complementary data signals on the true and complementary bit lines BL and/BL at the high speed and minimize the noise component being generated on the data signals, the supply voltage and the ground voltage. Furthermore, the cross coupled latch can minimize power consumption when the voltage difference Vcc–Vss is higher than the predetermined reference voltage.

As apparent from the above description, according to the present invention, the current signals to the cross coupled latch can be maintained constant in level regardless of the variation in the supply voltage so that the data signals can be sense-amplified at the improved speed when the supply voltage is lower than the reference voltage. Also, when the supply voltage is higher than the reference voltage, the sense amplifier of the present invention can minimize the noise component being generated and the power consumption. Therefore, the sense amplifier of the present invention has the effect of enhancing read and write operating speeds of the semiconductor memory device and preventing a faulty operation of the semiconductor memory device due to an error in the data signals.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A sense amplifier for a semiconductor memory device comprising:

latch means for sense-amplifying data signals on bit lines;

pull-up driving means connected between said latch means and a supply voltage source for controlling an amount of current of a supply voltage being supplied to said latch means;

pull-downdriving means connected between said latch means and a ground voltage source for controlling an amount of current of a ground voltage being supplied to said latch means; and voltage detection means for detecting a difference between the supply voltage and the ground voltage and controlling said pull-up driving means and said pull-down driving means in accordance with the detected result.

2. A sense amplifier for a semiconductor memory device as set forth in claim 1, wherein said pull-up driving means includes at least two MOS transistors connected in parallel between said supply voltage source and said latch means, at least one of said at least two MOS transistors of said pull-up driving means being driven by said voltage detection means, and wherein said pull-down driving means includes at least two MOS transistors connected in parallel between said ground voltage source and said latch means, at least one of said at least two MOS transistors of said pull-down driving means being driven by said voltage detection means.

* * * * *